(12) United States Patent
Lee et al.

(10) Patent No.: US 11,682,644 B2
(45) Date of Patent: Jun. 20, 2023

(54) SEMICONDUCTOR DEVICE WITH A HETEROGENEOUS SOLDER JOINT AND METHOD FOR FABRICATING THE SAME

(71) Applicant: Infineon Technologies AG, Neubiberg (DE)

(72) Inventors: Swee Kah Lee, Melaka (MY); Sook Woon Chan, Melaka (MY); Fong Mei Lum, Melaka (MY); Joachim Mahler, Regensburg (DE); Muhammad Muhammat Sanusi, Sungai Petani (MY)

(73) Assignee: Infineon Technologies AG, Neubiberg (DE)

( * ) Notice: Subject to any disclaimer, the term of this patent is extended or adjusted under 35 U.S.C. 154(b) by 21 days.

(21) Appl. No.: 17/361,950

(22) Filed: Jun. 29, 2021

(65) Prior Publication Data
US 2022/0005778 A1 Jan. 6, 2022

(30) Foreign Application Priority Data
Jul. 3, 2020 (DE) .......................... 10202117678.3

(51) Int. Cl.
*H01L 23/00* (2006.01)
(52) U.S. Cl.
CPC .............. *H01L 24/13* (2013.01); *H01L 24/11* (2013.01); *H01L 24/81* (2013.01); *H01L 2224/11822* (2013.01); *H01L 2224/1357* (2013.01); *H01L 2224/1362* (2013.01); *H01L 2224/13082* (2013.01); *H01L 2224/13111* (2013.01); *H01L 2224/13611* (2013.01); *H01L 2224/13613* (2013.01); *H01L 2224/13618* (2013.01); *H01L 2224/13638* (2013.01); *H01L 2224/13639* (2013.01); *H01L 2224/13647* (2013.01); *H01L 2224/13655* (2013.01); *H01L 2224/13657* (2013.01); *H01L 2224/13664* (2013.01); *H01L 2224/81801* (2013.01)

(58) Field of Classification Search
CPC ......... H01L 24/11; H01L 24/13; H01L 23/488
See application file for complete search history.

(56) References Cited

U.S. PATENT DOCUMENTS

| 2005/0006789 A1* | 1/2005 | Tomono | H01L 21/563 257/E23.068 |
| 2009/0095447 A1* | 4/2009 | Podhorsky | B23K 1/0016 165/104.19 |
| 2015/0311170 A1 | 10/2015 | Arvin et al. | |

FOREIGN PATENT DOCUMENTS

| DE | 102008031004 A1 | 12/2009 |
| DE | 102012201935 A1 | 8/2013 |

* cited by examiner

*Primary Examiner* — Dale E Page
*Assistant Examiner* — Wilner Jean Baptiste
(74) *Attorney, Agent, or Firm* — Murphy, Bilak & Homiller, PLLC (57) ABSTRACT

A method for fabricating a semiconductor device with a heterogeneous solder joint includes: providing a semiconductor die; providing a coupled element; and soldering the semiconductor die to the coupled element with a first solder joint. The first solder joint includes: a solder material including a first metal composition; and a coating including a second metal composition, different from the first metal composition, the coating at least partially covering the solder material. The second metal composition has a greater stiffness and/or a higher melting point than the first metal composition.

16 Claims, 5 Drawing Sheets

SEMICONDUCTOR DEVICE WITH A HETEROGENEOUS SOLDER JOINT AND METHOD FOR FABRICATING THE SAME

TECHNICAL FIELD

This disclosure relates in general to a semiconductor device with a heterogeneous solder joint and to a method for fabricating such a semiconductor device.

BACKGROUND

Semiconductor devices like for example semiconductor packages comprise solder joints electrically coupling individual parts of the semiconductor devices to one another. A failure in a solder joint, e.g. solder creep, solder bleed out or a crack may impair the electrical functionality of the semiconductor device. For example, the electrical resistance of the solder joint may increase or a short circuit may occur. Such a failure may be particularly problematic in power semiconductor devices configured to operate with a high electrical current and/or a high voltage. For these and other reasons it is desirable to provide semiconductor devices with improved solder joints as well as improved methods for fabricating semiconductor devices.

SUMMARY

Various aspects pertain to a method for fabricating a semiconductor device with a heterogeneous solder joint, the method comprising: providing a semiconductor die, providing a coupled element, and soldering the semiconductor die to the coupled element with a first solder joint, the first solder joint comprising: a solder material comprising a first metal composition, and a coating comprising a second metal composition, different from the first metal composition, the coating at least partially covering the solder material, wherein the second metal composition has a greater stiffness and/or a higher melting point than the first metal composition.

Various aspects pertain to a semiconductor device with a heterogeneous solder joint, the semiconductor device comprising: a semiconductor die, a coupled element, and a first solder joint coupling the semiconductor die to the coupled element, the first solder joint comprising: a solder material comprising a first metal composition, and a coating comprising a second metal composition, different from the first metal composition, the coating at least partially covering the solder material, wherein the second metal composition has a greater stiffness and/or a higher melting point than the first metal composition.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

DETAILED DESCRIPTION

In the following detailed description, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration only.

To the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a semiconductor device described below may use various types of semiconductor chips or circuits incorporated in the semiconductor chips, among them AC/DC or DC/DC converter circuits, power MOS transistors, power Schottky diodes, JFETs (Junction Gate Field Effect Transistors), power bipolar transistors, logic integrated circuits, analogue integrated circuits, power integrated circuits, chips with integrated passives, etc. The examples may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip.

Further, one or more logic integrated circuits may be included in the devices. The logic integrated circuits may be configured to control the integrated circuits of other semiconductor dies, for example the integrated circuits of power semiconductor dies. The logic integrated circuits may be implemented in logic dies.

Figure 1:
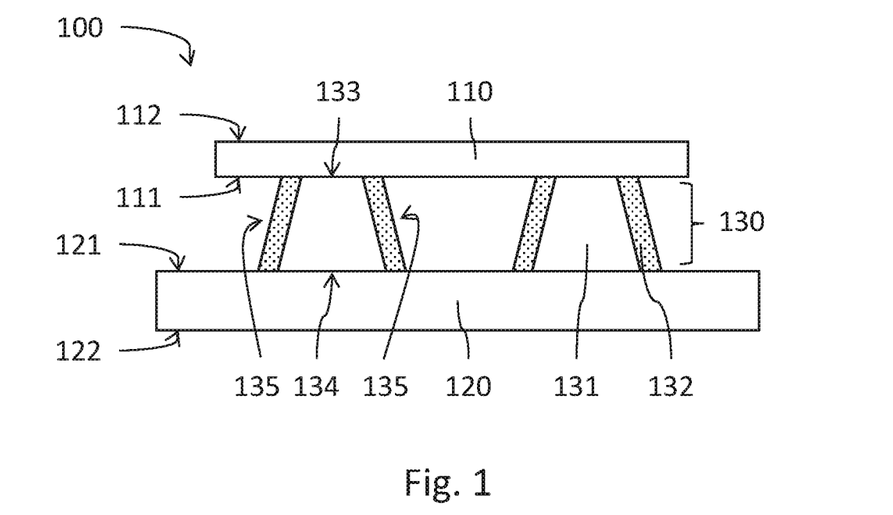
FIG. 1 shows a cross-sectional view of a semiconductor device comprising a semiconductor die and a coupled element which are coupled to one another by a heterogeneous solder joint.

FIG. 1 shows a semiconductor device 100 comprising a semiconductor die 110, a coupled element 120 and a first solder joint 130 coupling the semiconductor die 110 to the coupled element 120. The first solder joint 130 comprises a solder material 131 comprising a first metal composition and a coating 132 comprising a second metal composition, wherein the second metal composition is different from the first metal composition. Furthermore, the second metal composition has a greater stiffness and/or a higher melting point than the first metal composition. The coating 132 at least partially covers the solder material 131.

The semiconductor die 110 may comprise a first side 111 and an opposing second side 112 and the coupled element 120 may also comprise a first side 121 and an opposing second side 122. The semiconductor die 110 and the coupled element 120 may be arranged relative to each other such that the first sides 111, 121 face each other. The first solder joint 130 may be arranged between the first sides 111, 121. A first side 133 of the first solder joint 130 may face the semiconductor die 110 and an opposing second side 134 may face the coupled element 120. The first solder joint may furthermore comprise lateral sides 135 connecting the first and second sides 133, 134.

The semiconductor device 100 may comprise an encapsulation at least partially encapsulating the semiconductor die 110 and possibly also encapsulating the coupled element 120. The encapsulation may comprise a polymer material, e.g. a molded body, a glob top, a laminate and/or a plastic frame. The encapsulation may comprise an inorganic material, e.g. a cement or a glass based material. According to an example, the coupled element 120 may be at least partially exposed at an outer side of the encapsulation in order to provide an external terminal of the semiconductor device 100 and/or for dissipating heat away from the semiconductor die 110.

The semiconductor die 110 may be a power semiconductor die configured to operate with a high electrical current and/or a high voltage. The semiconductor die 110 may comprise a first power terminal (e.g. a source-, drain-, emitter-, or collector-terminal) on its first side 111 and the first solder joint 130 may be arranged on and electrically coupled to the first power terminal. The semiconductor die 110 may comprise a second power terminal, either on the first side 111 or on the second side 112 and a further first solder joint may be arranged on and electrically coupled to the second power terminal.

According to an example, the coupled element 120 comprises one or more of a die carrier, an electrical connector, a contact clip, a heatsink, a leadframe or leadframe part, a DCB (direct copper bond), a DAB (direct aluminum bond), an AMB (active metal brazing), a PCB (printed circuit board), and a further semiconductor die. The coupled element 120 may be electrically coupled to the semiconductor die 110 by the first solder joint 130. The coupled element 120 may be configured to provide mechanical support for the semiconductor die 110, to dissipate heat away from the semiconductor die 110 and/or to be part of an electrical circuit together with the semiconductor die 110.

The first solder joint 130 may have any suitable dimensions and it may cover any suitable part of the first side 111 of the semiconductor die 110, e.g. about 5%, 10%, 20%, 50%, 70% or close to 100% or 100%. The semiconductor device 100 may comprise a single first solder joint 130 or more than one first solder joints 130. In the case that the semiconductor device 100 comprises more than one first solder joints 130, the first solder joints 130 may have identical dimensions and/or identical material compositions or individual first solder joints 130 may have different dimensions and/or different material compositions.

According to an example, one or more intermediate elements are arranged between the first solder joint 130 and the semiconductor die 110. The intermediate element(s) may e.g. comprise intermediate layer(s) and/or a spacer element. The one or more intermediate layers may e.g. comprise a diffusion barrier layer, a contact layer, a corrosion prevention layer, etc. The one or more intermediate layers may e.g. comprise one or more of W, Tu, Al, Ni, Pd, Pt and Ti. The spacer element may for example comprise a metal pillar, in particular a pillar comprising or consisting of Al, Cu or any other suitable metal or metal alloy.

The first solder joint 130, in particular the solder material 131 may for example comprise a soft solder material, for example Sn. The solder material 131 may comprise one or more further metal components, e.g. Ag. According to an example, the amount of Ag is about 1.8%. The first solder joint 130, in particular the first metal composition may additionally comprise material of a metallization of the semiconductor die 110 and/or metal material of the coupled element 120.

The second metal composition of the coating 132 may comprise any suitable metals configured for providing the coating 132 with a greater stiffness and/or a higher melting point than the solder material 131. According to an example, the second metal composition comprises or consists of one or more of NiSn, CuSn, ZnSn, SbSn, BiSn, AgSn, CoSn, SiSn, CuNiSn, or CuPdSn. The coating 132 may in particular be different from a simple oxidation layer of the solder material 131. The first solder joint 130 may be termed a "heterogeneous solder joint" because of the different material compositions of the solder material 131 and the coating 132.

The coating 132 may for example be arranged on the lateral sides 135 of the first solder joint 130. In particular, the coating 132 may completely cover all lateral sides 135. According to an example, the coating 132 may additionally be arranged on the second side 134 facing the coupled element 120. The coating 132 may in particular partially or completely cover the second side 134. According to an example, the coating may cover, in particular partially or completely cover, the first side 133 facing the semiconductor die 110. It is possible that the part of the coating 132 on the lateral sides 135 and the part of the coating 132 on the second side 134 or the first side 133 have different material compositions. For example, the solder material 131 and the material of the coupled element 120 may react with one another and possibly also with the material of the coating 132 and may thereby change the material composition of the coating 132 on the second side 134 or on the first side 133 compared to the material composition of the coating 132 on the lateral sides 135.

According to an example, the semiconductor device 100 comprises more than one semiconductor die 110 and/or more than one coupled element 120 and at least some of these semiconductor dies 110 and coupled elements 120 are connected to each other by first solder joints 130.

According to an example, the semiconductor device 100 may comprise one or more second solder joints, wherein the one or more second solder joints have a different composition than the first solder joint 130. For example, the one or more second solder joints may be free of the coating 132.

Figure 2:
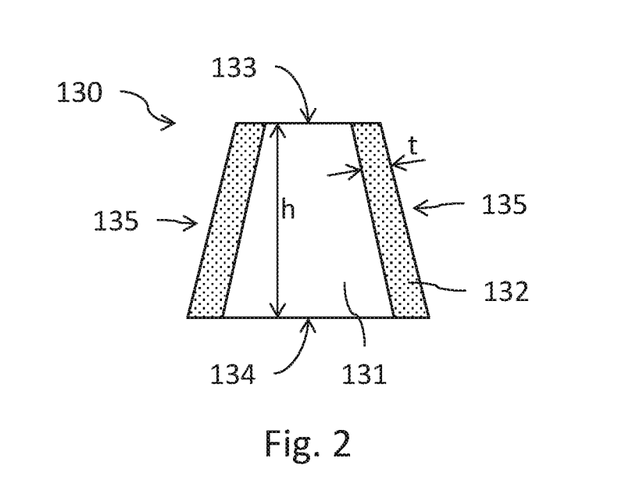
FIG. 2 shows a detailed view of a heterogeneous solder joint comprising a solder material and a coating which covers at least the lateral sides of the solder material.

FIG. 2 shows a schematic cross sectional view of the first solder joint 130 in greater detail. In the example of FIG. 2, the coating only covers the lateral sides 135 of the first solder joint 130, but not the first side 133 or the second side 134. However, as stated above, the coating 132 may for example also cover the second side 134.

The first solder joint 130 may for example have a height h measured between the first and second sides 133, 134 of several micrometer, e.g. about 5 µm or more, 10 µm or more, 20 µm or more, 50 µm or more, or 100 µm or more. The coating 132 may for example have a thickness t in the nanometer range or in the micrometer range. The thickness t may for example be about 10 nm or more, 20 nm or more, 50 nm or more, 100 nm or more, 200 nm or more, 500 nm or more, 1 µm or more, 2 µm or more, or 5 µm or more.

The first solder joint 130 need not necessarily have the shape shown in the schematic illustration of FIG. 2. For example, the first solder joint 130 may have a cylinder shape, a dome shape, a flat shape, a concave shape, a convex shape, its lateral sides 135 may have a meniscus shape, etc. According to an example, at least one side of the first solder joint 130 is not covered by the coating 132 and at least one other side, or at least two other sides or all other sides is/are covered by the coating 132.

Figure 3A:
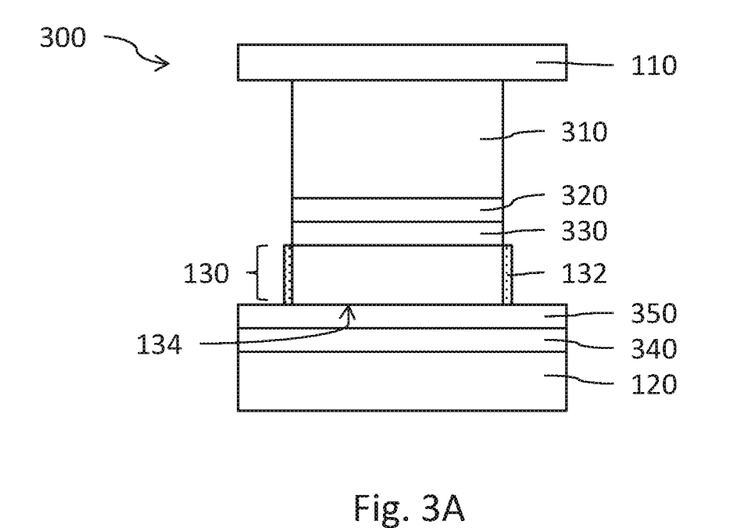
FIGS. 3A and 3B show detailed views of further semiconductor devices, wherein a heterogeneous solder joint is arranged on a spacer element.
Figure 3B:
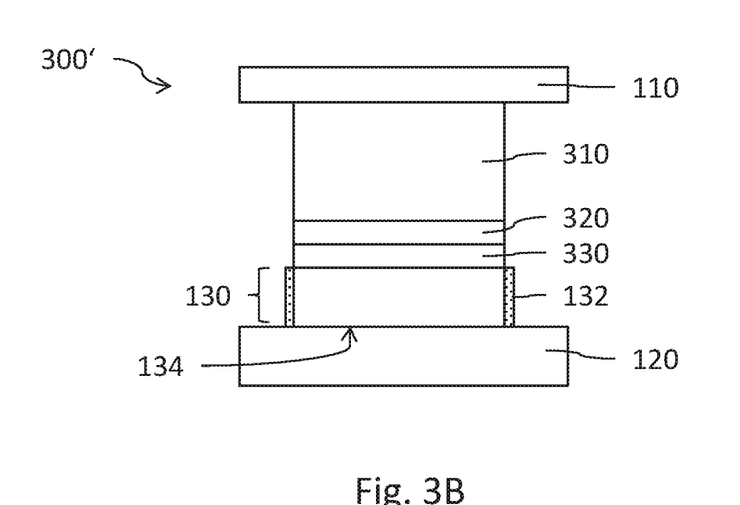

FIGS. 3A and 3B show detailed views of semiconductor devices 300 and 300', respectively, which may be similar to or identical with the semiconductor device 100, except for the differences described in the following. In particular, the semiconductor devices 300 and 300' comprise spacer elements 310 arranged between the semiconductor die 110 and the first solder joint 130.

In the examples shown in FIGS. 3A and 3B, the spacer element 310 comprises a metal pillar, for example a Cu pillar, an Al pillar, an Au pillar, etc. The spacer element 310 may have any suitable dimensions, e.g. a length l of 20 µm or more, 50 µm or more, 100 µm or more, 200 µm or more, 500 µm or more, or 1 mm or more.

The first solder joint 130 may be arranged directly on the spacer element 310. However, it is also possible that one or more intermediate layers are arranged between the spacer element 310 and the first solder joint 130. For example, a first intermediate layer 320 and a second intermediate layer 330 may be arranged between the first solder joint 130 and the spacer element 310. The first intermediate layer 320 may for example comprise or consist of Ni. The second intermediate layer 330 may for example comprise or consist of Cu or Pd.

In the semiconductor device 300 the coupled element 120 comprises a first metallization layer 340 and a second metallization layer 350 facing the first solder joint 130. However, it is also possible that the semiconductor device 300 comprises only the first metallization layer 340 or only the second metallization layer 350. The first metallization layer 340 may for example comprise or consist of Ni. The second metallization layer 350 may for example comprise or consist of Cu or Pd. Providing the first and/or second metallization layers 340, 350 may for example comprise an act of plating over the coupled element 120. The first and/or the second metallization layers 340, 350 may for example have a thickness in the range of 3 nm to 1.5 µm, for example about 15 nm, about 25 nm, about 50 nm, about 100 nm, or about 500 nm.

In the semiconductor device 300' the coupled element 120 does not comprise a metallization layer. Instead, the first solder joint is arranged directly on the bulk of the coupled element 120. In this case, the coupled element 120 may for example comprise or consist of Cu. The surface of the coupled element 120 may for example comprise a structuring, e.g. dimples or etched structures. Such a structuring may e.g. improve the adhesion of the first solder joint 130.

The FIGS. 3A and 3B show the coating 132 to be only arranged on the lateral sides 135 of the first solder joint 130. However, as already noted previously, the coating 132 may for example also be arranged on the second side 134. According to an example, the coating 132 covers the second side 134 only partially, such that solder material 131 may be in direct contact with the coupled element 120.

Figure 4A:
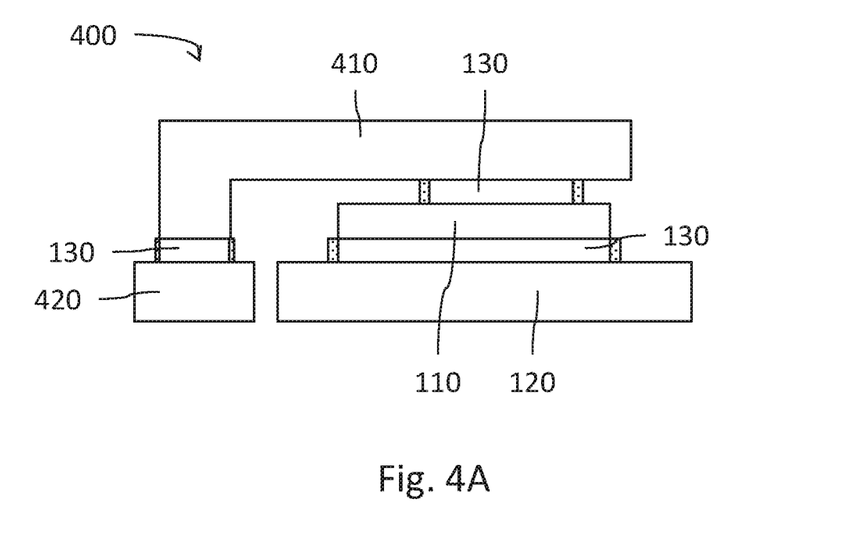
FIGS. 4A and 4B show cross-sectional views of further semiconductor devices, wherein a heterogeneous solder joint may be arranged between a semiconductor die and a contact clip (FIG. 4A) or between two semiconductor dies (FIG. 4B).
Figure 4B:
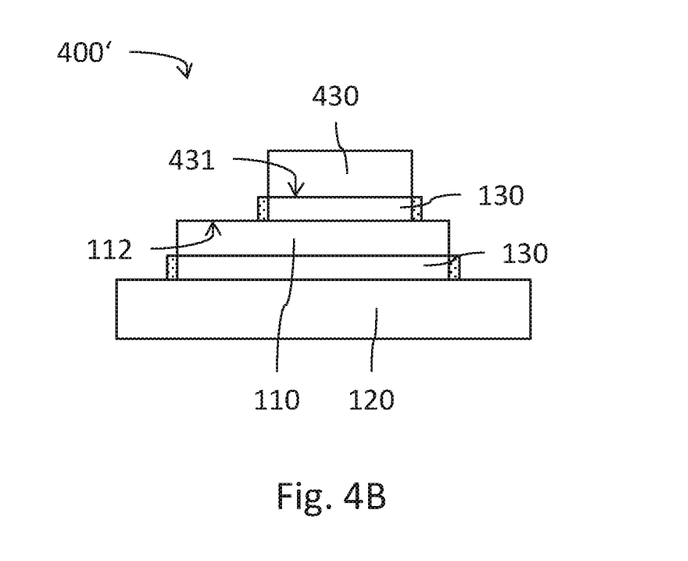

FIGS. 4A and 4B show further semiconductor devices 400 and 400', respectively, which may be similar to or identical with the semiconductor devices 100, 300 and 300'.

The semiconductor device 400 comprises the semiconductor die 110, the coupled element 120 and a further coupled element 410. The further coupled element 410 may be of a similar or identical type as the coupled element 120, for example a further DCB or leadframe part or PCB or, as shown in FIG. 4A, a contact clip. The coupled element 120 may be arranged facing the first side 111 of the semiconductor die 110 and the further coupled element 410 may be arranged facing the second side 112 of the semiconductor die 110. In other words, the semiconductor die 110 may be arranged between the coupled elements 120, 410.

The further coupled element 410 may be coupled to the semiconductor die 110 by a first solder joint 130, similar to the coupled element 120. The further coupled element 410 may comprise or consist of the same material or material composition as the coupled element 120, e.g. Cu, Ni or Pd. Furthermore, the further coupled element 410 may comprise one or more metallization layers like the first and second metallization layers 340, 350 described above with reference to FIG. 3A. However, it is also possible that the further coupled element 410 comprises or consists of a different material or material composition than the coupled element 120.

The semiconductor device 400 comprises the first solder joints 130 coupling the coupled elements 120, 410 to the semiconductor die 110 and it may comprise a further first solder joint 130 coupling the further coupled element 410 to a contact part 420. For example, the further coupled element 410 may be a contact clip and the contact part 420 may be a contact, e.g. an internal contact or an external contact, of the semiconductor device 400. In more general terms, a first solder joint 130 need not necessarily be arranged on a semiconductor die 110 but may instead be arranged between any two suitable electrically conducting parts of a semiconductor device.

According to an example, a spacer element, e.g. the spacer element 310, may be arranged between the semiconductor die 110 and the further coupled element 410. The spacer element may in particular be arranged between the semiconductor die 110 and the first solder joint 130 coupling the further coupled element 410 to the semiconductor die 110.

The semiconductor device 400' shown in FIG. 4B comprises the semiconductor die 110 and a further semiconductor die 430 arranged over the second side 112 of the semiconductor die 110. A first solder joint 130 couples the further semiconductor die 430 to the semiconductor die 110. The further semiconductor die 430 may for example be a power semiconductor die. The semiconductor dies 110, 430 may for example be coupled together to form an electrical circuit like a half-bridge circuit.

According to an example, a spacer element like the spacer element 310 may be arranged between the semiconductor dies 110, 430. The spacer element may be arranged directly on the second side 112 of the semiconductor die 110 and the first solder joint 130 may be arranged on top of the spacer element. According to another example, the spacer element may be arranged directly on a lower side 431 of the further semiconductor die 430 and the first solder joint 130 may be arranged between the spacer element and the first side 112 of the semiconductor die 110.

FIGS. 5A to 5F show a semiconductor device 500 in various stages of fabrication according to an exemplary method for fabricating a semiconductor device. Similar methods may be used for fabricating the semiconductor devices 100, 300, 300', 400 and 400'.

Figure 5A:
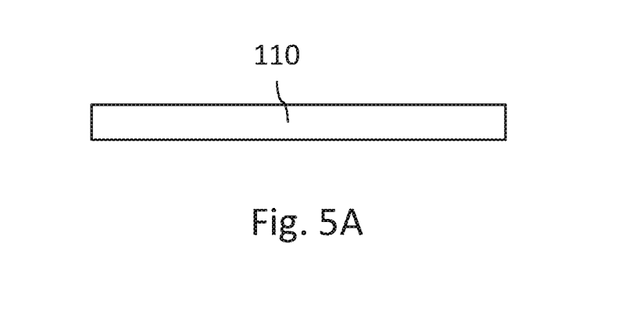
FIGS. 5A to 5F show cross-sectional views of a semiconductor device in various stages of fabrication according to an exemplary method for fabricating a semiconductor device.

As shown in FIG. 5A, the semiconductor die 110 is provided. According to an example, the semiconductor die 110 is still part of a semiconductor wafer at this point. According to another example, a singulated die is provided. The semiconductor die 110 may be a thinned die, meaning that e.g. a backside grinding process was used to reduce the thickness of the semiconductor die 110.

Figure 5B:
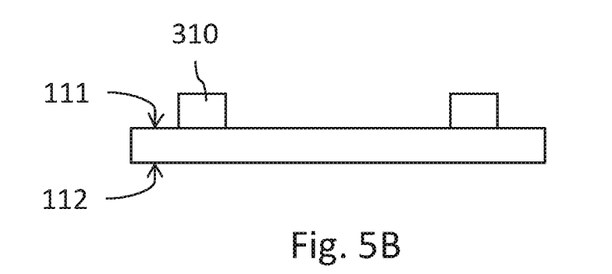

As shown in FIG. 5B, one or more spacer elements 310 are fabricated on the semiconductor die 110. Fabricating the spacer elements 310 may for example comprise plating over the semiconductor die 110. The spacer elements 310 may be fabricated on the first side 111, on the second side 112 or on both sides 111, 112 of the semiconductor die 110.

The act of fabricating the spacer elements 310 is optional and in the case that a semiconductor device without spacer elements is to be fabricated, no spacer elements 310 are provided on the semiconductor die 110.

According to an example, after the spacer elements 310 have been fabricated, one or more intermediate layers like the intermediate layers 320, 330 are fabricated on the spacer elements 310. This may e.g. comprise plating over the spacer elements 310. According to another example, no intermediate layers are provided.

Figure 5C:
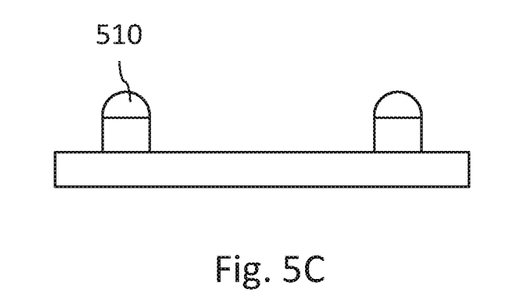

As shown in FIG. 5C, solder deposits 510 are deposited on the spacer elements 310. In the case that no spacer elements 310 were fabricated, the solder deposits 510 are deposited on the semiconductor die 110 instead.

The solder deposits 510 may comprise the solder material 131 or a precursor of the solder material 131. However, according to an example, the solder deposits 510 do not comprise the material of the coating 132.

Figure 5D:
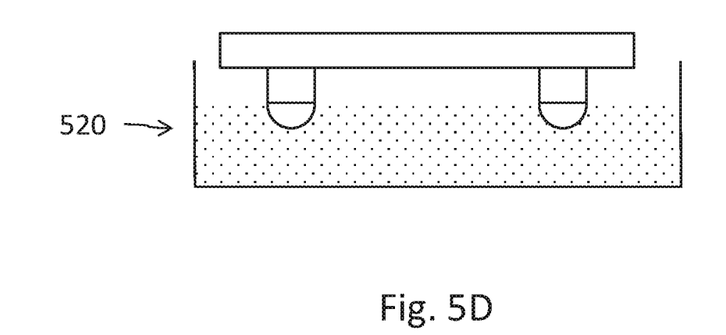

As shown in FIG. 5D, the solder deposits 510 are dipped into a bath 520 with an ionic liquid in order to form a precursor of the coating 132 on the solder deposits 510. A metal salt, e.g. an inorganic metal salt, is dissolved in the ionic liquid (which may act as a co-solvent system) and the metal salt comprises a metal constituent that is used to form the coating precursor. The metal salt may for example be an ammonium carbonate salt, a bicarbonate salt, a formate or an amine salt.

According to an example, the metal salt comprises one or more of copper ammonium carbonate, cobalt ammonium carbonate, nickel ammonium carbonate, antimony acetate, bismuth acetate, and zinc acetate. According to an example, the ionic liquid comprises an alkylimidazolium carboxylate or an alkylammonium carboxylate. The ionic liquid may for example have a melting point below 20° C. and a boiling point in the range of 100° C. to 200° C. The metal salt may be comprised in the ionic liquid in any suitable concentration.

The solder deposits 510 may be dipped into the bath 520 for any suitable duration, e.g. is or more, 5 s or more, 10 s or more, 30 s or more, 1 min or more, 5 min or more, or 10 min or more. The ionic liquid of the bath 520 may have any suitable temperature, e.g. room temperature or it may be heated above room temperature. The coating precursor may for example be formed at a temperature that is lower than the liquidus temperature of the solder material 131. The ionic liquid may act as a co-solvent for the metal salt and for an organic flux. The organic flux may comprise an organic acid and a tackifier.

According to an example, the bath 520 with the ionic liquid is configured as a solder flux. In the case that the ionic liquid comprises chloride or fluoride anions, it may be used to e.g. remove an oxide layer from the solder deposits 510 in addition to delivering the coating precursor. In other words, these two functions may be performed simultaneously by the bath 520.

Figure 5E:
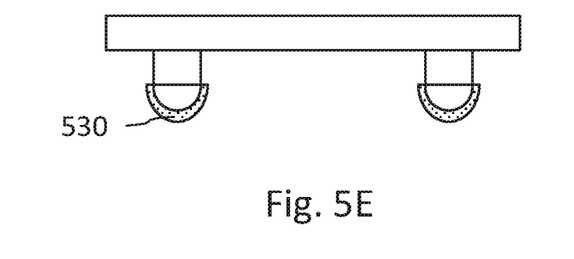

FIG. 5E shows a stage of fabrication after the solder deposit 510 has been dipped into the bath 520. A coating precursor 530 has formed on the surface of the solder deposit 510. The coating precursor 530 may have a different material composition than the finished coating 132.

Figure 5F:
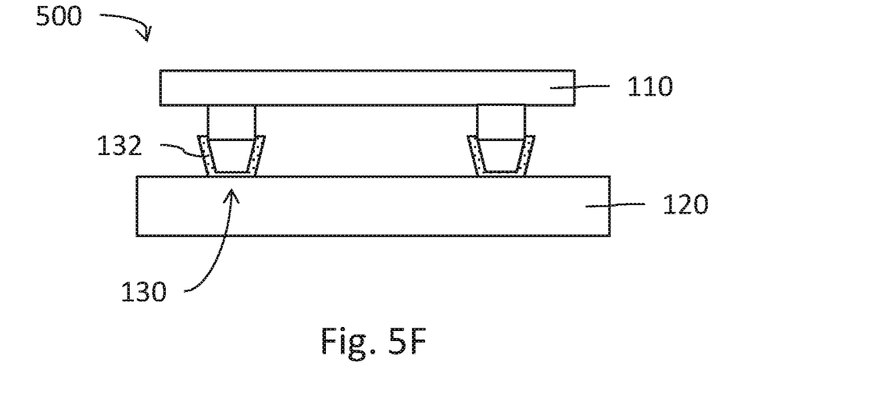

As shown in FIG. 5F, the semiconductor die 110 is soldered (e.g. reflow soldered) to the coupled element 120, thereby forming the first solder joint 130. Soldering may comprise applying heat to the solder deposit 510 and to the coating precursor 530. Soldering may comprise converting the coating precursor 530 into the coating 132. This conversion may be due to the heat applied to the coating precursor 530. According to an example, the act of heating forms the coating by reducing the metal salt present in the coating precursor 530 to metal or metal oxide (and possibly also N and/or $CO_2$). Any oxide present will be in situ cleaned by the solder flux. Thereby, the second metal composition of the coating 132 may be formed.

According to an example, the coating precursor 530 is converted into the coating 132 at a temperature that is lower than the liquidus temperature of the solder material 131. The coating 132 may also have a higher melting point and/or a greater stiffness than the solder material 131 (that is, the second material composition of the coating 132 may e.g. have a greater Young's modulus than the first material composition of the solder material 131). This way, the coating 132 may act as a barrier which may e.g. prevent solder bleed out or solder creep. In other words, the coating 132 may be configured as a reinforcing structure of the first solder joint 130.

For example, the coating precursor may be transformed into the coating 132 at a temperature in the range of 180° C. to 220° C. The liquidus temperature of the solder material 131 may for example be in the range of 200° C. to 260° C.

According to another example, the coating precursor 530 is converted into the coating 132 at approximately the liquidus temperature of the solder material 131.

According to an example, the act of soldering comprises using a forming gas, for example a forming gas comprising N and H. The forming gas may facilitate the reduction of the metal salt into metal.

Figure 6:
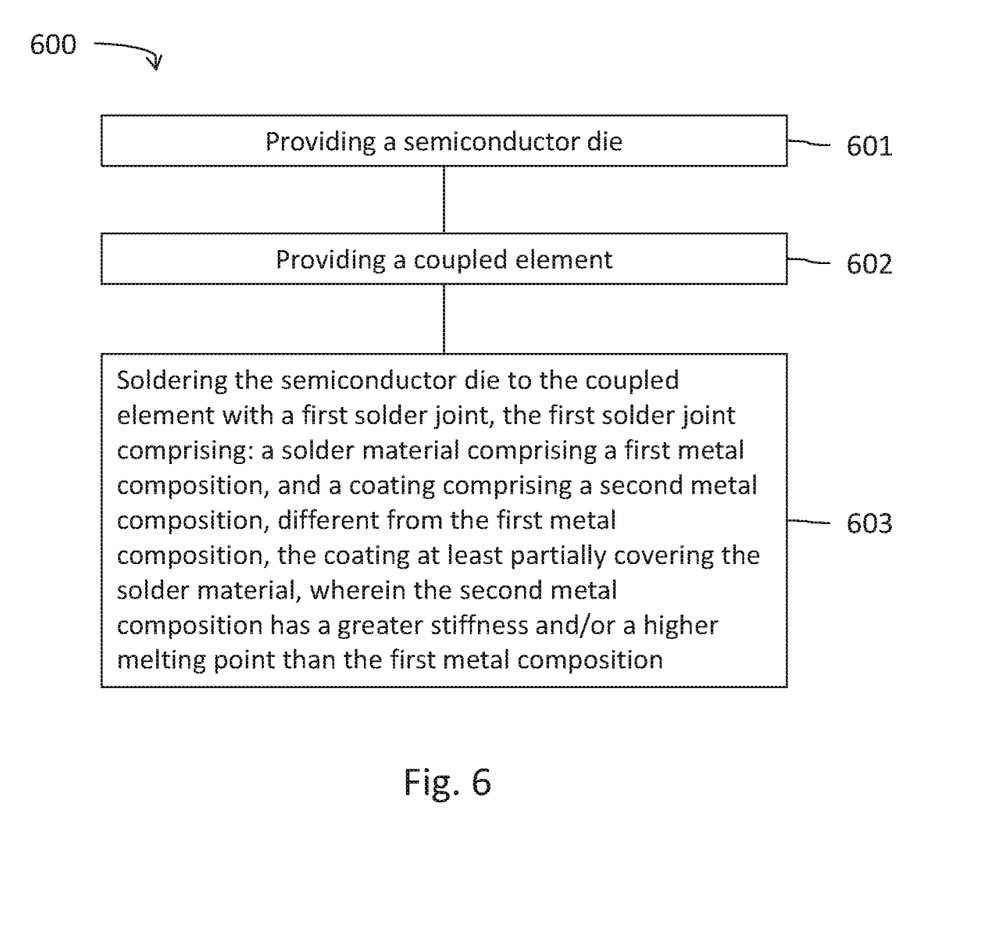
FIG. 6 is a flow chart of an exemplary method for fabricating a semiconductor device.

FIG. 6 is a flow chart of a method 600 for fabricating a semiconductor device. The method 600 may for example be used for fabricating the semiconductor devices 100 to 500.

At 601 the method 600 comprises an act of providing a semiconductor die, at 602 an act of providing a coupled element, and at 603 an act of soldering the semiconductor die to the coupled element with a first solder joint, the first solder joint comprising: a solder material comprising a first metal composition, and a coating comprising a second metal composition, different from the first metal composition, the coating at least partially covering the solder material, wherein the second metal composition has a greater stiffness and/or a higher melting point than the first metal composition.

According to an example of the method 600, the solder material is covered with a coating precursor prior to soldering the semiconductor die to the coupled element and soldering the semiconductor die to the coupled element further comprises converting the coating precursor into the coating, e.g. by applying heat and thereby enabling a reduction reaction in the coating precursor.

In the following, the semiconductor device and the method for fabricating a semiconductor device are further explained using specific examples.

Example 1 is a method for fabricating a semiconductor device with a heterogeneous solder joint, the method comprising: providing a semiconductor die, providing a coupled element, and soldering the semiconductor die to the coupled element with a first solder joint, the first solder joint comprising: a solder material comprising a first metal composition, and a coating comprising a second metal composition, different from the first metal composition, the coating at least partially covering the solder material, wherein the second metal composition has a greater stiffness and/or a higher melting point than the first metal composition.

Example 2 is the method of example 1, wherein the solder material is covered with a coating precursor prior to soldering the semiconductor die to the coupled element, and wherein soldering the semiconductor die to the coupled element further comprises converting the coating precursor into the coating.

Example 3 is the method of example 2, further comprising: depositing the solder material on the semiconductor die or on the coupled element, and afterwards covering the deposited solder material with the coating precursor.

Example 4 is the method of example 2 or 3 wherein soldering the semiconductor die to the coupled element comprises heating the deposited solder material to melt the deposited solder material, and wherein the act of heating the deposited solder material forms the coating of the second metal composition from the coating precursor.

Example 5 is the method of example 4, wherein the act of heating the deposited solder material forms the coating by reducing a metal present in the coating precursor to form the second metal composition.

Example 6 is the method of one of examples 2 to 5, wherein the coating precursor is a solder flux containing a metal dopant.

Example 7 is the method of one of examples 2 to 6, wherein the solder material is dipped into a bath with ionic liquid in order to form the coating precursor.

Example 8 is the method of example 7, wherein an inorganic metal salt is dissolved in the ionic liquid, and wherein a metal constituent of the inorganic metal salt is used to form the coating.

Example 9 is the method of example 8, wherein the inorganic metal salt comprises one or more of copper ammonium carbonate, cobalt ammonium carbonate, nickel ammonium carbonate, antimony acetate, bismuth acetate, and zinc acetate.

Example 10 is the method of one of examples 7 to 9, wherein the ionic liquid comprises an alkylimidazolium carboxylate or an alkylammonium carboxylate.

Example 11 is the method of one of examples 2 to 10, wherein the coating precursor is formed at a temperature that is lower than the liquidus temperature of the solder material.

Example 12 is the method of one of the preceding examples, wherein the coating is formed around the solder material such that spilling of solder material out of the solder joint is prevented by the coating.

Example 13 is a semiconductor device with a heterogeneous solder joint, the semiconductor device comprising: a semiconductor die, a coupled element, and a first solder joint coupling the semiconductor die to the coupled element, the first solder joint comprising: a solder material comprising a first metal composition, and a coating comprising a second metal composition, different from the first metal composition, the coating at least partially covering the solder material, wherein the second metal composition has a greater stiffness and/or a higher melting point than the first metal composition.

Example 14 is the semiconductor device of example 13, wherein the coupled element comprises one or more of a die carrier, a contact clip, a leadframe, a DCB, a DAB, a PCB, and a further semiconductor die.

Example 15 is the semiconductor device of example 13 or 14, wherein the first solder joint comprises a first side facing the semiconductor die, an opposing second side facing the coupled element and lateral sides connecting the first and second sides, and wherein the coating covers the lateral sides but not the first side.

Example 16 is the semiconductor device of one of examples 13 to 15, wherein the coating has a thickness in the range of 10 nm to 5 µm.

Example 17 is the semiconductor device of one of examples 13 to 16, wherein the first metal composition comprises Sn.

Example 18 is the semiconductor device of one of examples 13 to 17, wherein the second metal composition comprises one or more of NiSn, CuSn, ZnSn, SbSn, BiSn, AgSn, CoSn, SiSn, CuNiSn, and CuPdSn.

Example 19 is the semiconductor device of one of examples 13 to 18, further comprising: a metal pillar arranged on the semiconductor die, wherein the first solder joint is arranged on the metal pillar.

Example 20 is an apparatus comprising means for performing the method according to anyone of examples 1 to 12.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A method for fabricating a semiconductor device with a heterogeneous solder joint, the method comprising:
   providing a semiconductor die;
   providing a coupled element; and
   soldering the semiconductor die to the coupled element with a final first solder joint, the final first solder joint comprising:
      a solder material comprising a first metal composition; and
      a coating comprising a second metal composition, different from the first metal composition, the coating at least partially covering the solder material,
   wherein the second metal composition has a greater stiffness and/or a higher melting point than the first metal composition.

2. The method of claim 1, wherein the solder material is covered with a coating precursor prior to soldering the semiconductor die to the coupled element, and wherein soldering the semiconductor die to the coupled element further comprises converting the coating precursor into the coating.

3. The method of claim 2, further comprising:
depositing the solder material on the semiconductor die or on the coupled element; and
afterwards covering the deposited solder material with the coating precursor.

4. The method of claim 3, wherein soldering the semiconductor die to the coupled element comprises heating the deposited solder material to melt the deposited solder material, and wherein the act of heating the deposited solder material forms the coating of the second metal composition from the coating precursor.

5. The method of claim 4, wherein the act of heating the deposited solder material forms the coating by reducing a metal present in the coating precursor to form the second metal composition.

6. The method of claim 2, wherein the coating precursor is a solder flux containing a metal dopant.

7. The method of claim 2, wherein the solder material is dipped into a bath with ionic liquid to form the coating precursor.

8. The method of claim 7, wherein an inorganic metal salt is dissolved in the ionic liquid, and wherein a metal constituent of the inorganic metal salt is used to form the coating.

9. The method of claim 8, wherein the inorganic metal salt comprises one or more of copper ammonium carbonate, cobalt ammonium carbonate, nickel ammonium carbonate, antimony acetate, bismuth acetate, and zinc acetate.

10. The method of claim 7, wherein the ionic liquid comprises an alkylimidazolium carboxylate or an alkylammonium carboxylate.

11. The method of claim 7, wherein the ionic liquid comprises chloride or fluoride anions.

12. The method of claim 2, wherein the coating precursor is formed at a temperature that is lower than a liquidus temperature of the solder material.

13. The method of claim 1, wherein the coating is formed around the solder material such that the coating prevents spilling of the solder material out of the solder joint.

14. The method of claim 1 wherein soldering the semiconductor die to the coupled element comprises using a forming gas.

15. A method for fabricating a semiconductor device with a heterogeneous solder joint, the method comprising:
providing a semiconductor die;
providing a coupled element; and
soldering the semiconductor die to the coupled element with a final first solder joint, the final first solder joint comprising:
a solder material comprising a first metal composition; and
a coating comprising a second metal composition, different from the first metal composition, the coating completely covering at least one lateral side of the solder material,
wherein the second metal composition has a greater stiffness and/or a higher melting point than the first metal composition.

16. A method for fabricating a semiconductor device with a heterogeneous solder joint, the method comprising:
providing a semiconductor die;
providing a coupled element; and
soldering the semiconductor die to the coupled element with a final first solder joint, the final first solder joint comprising:
a solder material comprising a first metal composition; and
a coating comprising a second metal composition, different from the first metal composition, the coating at least partially covering the solder material,
wherein the second metal composition has a greater stiffness and/or a higher melting point than the first metal composition,
wherein the solder material is covered with a coating precursor prior to soldering the semiconductor die to the coupled element,
wherein soldering the semiconductor die to the coupled element further comprises converting the coating precursor into the coating.

* * * * *

UNITED STATES PATENT AND TRADEMARK OFFICE
CERTIFICATE OF CORRECTION

| | |
|---|---|
| PATENT NO. | : 11,682,644 B2 |
| APPLICATION NO. | : 17/361950 |
| DATED | : June 20, 2023 |
| INVENTOR(S) | : S. Lee et al. |

It is certified that error appears in the above-identified patent and that said Letters Patent is hereby corrected as shown below:

On the Title Page

Foreign App. Data item (30) please change "10202117678.3" to -- 102020117678.3 --

Signed and Sealed this
Twenty-ninth Day of August, 2023

Katherine Kelly Vidal
*Director of the United States Patent and Trademark Office*